(12) United States Patent
Furuta et al.

(10) Patent No.: US 7,981,734 B2
(45) Date of Patent: Jul. 19, 2011

(54) MANUFACTURING METHOD OF THIN FILM TRANSISTOR INCLUDING LOW RESISTANCE CONDUCTIVE THIN FILMS

(75) Inventors: Mamoru Furuta, Kochi (JP); Takashi Hirao, Kochi (JP); Hiroshi Furuta, Kochi (JP); Tokiyoshi Matsuda, Kochi (JP); Takahiro Hiramatsu, Kochi (JP); Hiromitsu Ishii, Hamura (JP); Hitoshi Hokari, Hamura (JP); Motohiko Yoshida, Hamura (JP)

(73) Assignees: Kochi Industrial Promotion Center, Kochi-Shi (JP); Casio Computer Co., Ltd., Tokyo (JP)

( * ) Notice: Subject to any disclaimer, the term of this patent is extended or adjusted under 35 U.S.C. 154(b) by 36 days.

(21) Appl. No.: 12/499,559

(22) Filed: Jul. 8, 2009

(65) Prior Publication Data
US 2009/0269881 A1    Oct. 29, 2009

Related U.S. Application Data

(62) Division of application No. 11/701,343, filed on Feb. 1, 2007, now Pat. No. 7,576,394.

(30) Foreign Application Priority Data

Feb. 2, 2006    (JP) .................................. 2006-026320

(51) Int. Cl.
*H01L 21/302* (2006.01)

(52) U.S. Cl. ........ 438/149; 438/104; 438/151; 438/158; 438/159; 438/161; 438/479; 438/584; 438/585; 438/696; 438/706; 438/720; 438/722; 438/742; 257/E21.256; 257/E21.31; 257/E21.37

(58) Field of Classification Search .................. 438/104, 438/151, 158, 159, 161, 479, 686, 706, 720, 438/722, 742, 149, 584, 585; 257/E21.411, 257/E21.256, E21.31, E21.37
See application file for complete search history.

(56) References Cited

U.S. PATENT DOCUMENTS
5,650,358 A    7/1997    Gu et al.
(Continued)

FOREIGN PATENT DOCUMENTS
JP    2003-037268         2/2003
JP    2004-349583 A       12/2004
JP    2005-33172 A        2/2005

OTHER PUBLICATIONS

Chinese Office Action dated Jul. 8, 2010 and English translation thereof in counterpart Chinese Application Chinese No. 200780000580.2.

*Primary Examiner* — Ngan Ngo
*Assistant Examiner* — Benjamin Tzu-Hung Liu
(74) *Attorney, Agent, or Firm* — Holtz, Holtz, Goodman & Chick, PC

(57) ABSTRACT

A manufacturing method of a thin film transistor includes forming a pair of source/drain electrodes on a substrate, such that the source/drain electrodes define a gap therebetween; forming low resistance conductive thin films, which define a gap therebetween, on the source/drain electrodes; and forming an oxide semiconductor thin film layer on upper surface of the low resistance conductive thin films and in the gap defined between the low resistance conductive thin films so that the oxide semiconductor thin film layer functions as a channel. The low resistance conductive thin films and the oxide semiconductor thin film layer are etched so that side surfaces of the resistance conductive thin films and corresponding side surfaces of the oxide semiconductor thin film layer coincide with each other in a channel width direction of the channel. A gate electrode is mounted over the oxide semiconductor thin film layer.

8 Claims, 9 Drawing Sheets

U.S. PATENT DOCUMENTS

| | | |
|---|---|---|
| 5,898,187 A | 4/1999 | Kim |
| 6,180,438 B1 | 1/2001 | Deane et al. |
| 6,285,041 B1 * | 9/2001 | Noguchi ........................ 257/61 |
| 7,402,506 B2 * | 7/2008 | Levy et al. .................... 438/584 |
| 7,501,293 B2 * | 3/2009 | Ito et al. ........................ 438/22 |
| 2006/0244107 A1 * | 11/2006 | Sugihara et al. .............. 257/646 |

* cited by examiner

MANUFACTURING METHOD OF THIN FILM TRANSISTOR INCLUDING LOW RESISTANCE CONDUCTIVE THIN FILMS

CROSS-REFERENCE TO RELATED APPLICATIONS

This application is a Divisional Application of U.S. application Ser. No. 11/701,343 filed Feb. 1, 2007 now U.S. Pat. No. 7,576,394, which is based upon and claims the benefit of priority from the prior Japanese Patent Application No. 2006-26320, filed on Feb. 2, 2006, the entire contents of which are incorporated herein by reference.

BACKGROUND OF THE INVENTION

1. Field of the Invention

The present invention relates to a manufacturing method of a thin film transistor including low resistance conductive thin films.

2. Description of the Background Art

It has been known for many years that oxides such as zinc oxide or magnesium zinc oxide have excellent characteristics as a semiconductor (an active layer). In recent years, active research and development of a semiconductor thin film layer using these compounds have been made in order to apply such a semiconductor thin film layer to electronic devices such as a thin film transistor (hereinafter abbreviated as TFT), a light emitting device, and a transparent conductive film.

An oxide TFT including a semiconductor thin film layer made of zinc oxide or magnesium zinc oxide has greater electron mobility and better TFT characteristics than an amorphous silicon TFT including a semiconductor thin film layer of amorphous silicon (a-Si: H), which has been mainly used for liquid crystal displays. Another advantage of the oxide TFTs is that high electron mobility can be expected because a crystalline thin film is formed even at a temperature as low as a room temperature. These advantages have been encouraging the development of the oxide TFTs.

TFTs using an oxide semiconductor thin film layer, such as a bottom gate type TFT (see, for example, Japanese Patent Publications No. 2005-033172 and No. 2004-349583) and a top gate type TFT, have been reported.

The bottom gate type TFTs include, for example, a lamination of a gate electrode disposed over a substrate, a gate insulating film, source/drain electrodes, and an oxide semiconductor thin film layer, which are laminated in this order.

On the other hand, the top gate type TFTs, for example, include a lamination of source/drain electrodes disposed over a substrate, an oxide semiconductor thin film layer, a gate insulating film, and a gate electrode, which are laminated in this order.

In both of the bottom and top gate type TFTs, sufficient contact is required between each of the source/drain electrodes and the oxide semiconductor thin film layer (primarily comprising zinc oxide and the like) in order to ensure high current drive power.

In a conventional method, a source/drain region having lower resistance than the oxide semiconductor thin film layer is provided to improve the contact property between the source/drain electrodes and the oxide semiconductor thin film layer.

FIG. 9A shows a TFT 500 as one example of the TFTs provided according to the conventional method. The TFT 500 has a pair of low resistance conductive thin films 110 sandwiched between the oxide semiconductor thin film layer 103 and a pair of source/drain electrodes 102 placed on a substrate 101. Since the low resistance conductive thin films 110 have a lower resistance than the oxide semiconductor thin film layer 103, they improve the contact between each of the source/drain electrodes 102 and the oxide semiconductor thin film layer 103. The oxide semiconductor thin film layer 103 is disposed on the low resistance conductive thin films 110 and on an area of the substrate 101 exposed between the pair of low resistance conductive thin films 110, while the outer periphery 110a (See FIG. 9B described below for a plan view) of the low resistance conductive thin films 110 remains uncovered. All the exposed surfaces of the oxide semiconductor thin film layer 103 are covered with a gate insulating film 104. A gate electrode 106 is disposed over the gate insulating film 104. FIG. 9B is a plan view of an array of the TFTs 500 shown in FIG. 9A. In FIG. 9B, two of the TFTs 500 are aligned in parallel. FIG. 9A is a cross sectional view along line IXA-IXA of FIG. 9B. For clarity, FIG. 9B omits gate insulating film 104 shown in FIG. 9A In manufacturing the TFT 500, first a pair of source/drain electrodes 102 is patterned and then the low resistance conductive thin film 110 is formed. The low resistance conductive thin film 110 is separated into a plurality of low resistance conductive thin films 110 that are spaced apart from each other, using a photo-lithography technique. Accordingly, an outer periphery 110a (cross-hatched in FIG. 9B) of the low resistance conductive thin films 110 protrudes from the outer profile of the oxide semiconductor thin film layer 103. As shown in FIG. 9B, at least a distance D (distance D=width A+gap B+width A) is needed between the oxide semiconductor thin film layers of the TFTs. A narrower distance D is preferable in order to achieve higher integration of TFTs. The width A is defined by the mask-alignment accuracy of an aligner in other words, by the alignment accuracy in the photo-lithography of the low resistance conductive thin film 110 and the oxide semiconductor thin film layer 103. The higher the alignment accuracy is, the smaller the width A becomes. On the other hand, the gap B is defined by the minimum resolution during the patterning of the low resistance conductive thin film 110. The higher the minimum resolution is, the smaller the gap B becomes. When a conventional aligner for an LCD is used, the width A determined by the alignment accuracy, is about 1.5 µm, and the gap B determined by the minimum resolution is about 4.0 µm. Therefore, in the conventional TFT 500, the distance D between the oxide semiconductor thin film layers 103 is approximately 7.0 µm (1.5 µm+4.0 µm+1.5 µm) (see FIG. 9B).

On the other hand, in manufacturing a TFT that includes no low resistance conductive thin film, an oxide semiconductor thin film layer is laid over the source/drain electrodes of a plurality of TFTs, and then the oxide semiconductor thin film layer is patterned. Therefore, the width A required in TFT 500 according to the mask-alignment accuracy is not necessary. Thus the width A is eliminated from the distance D so that the distance D includes only the gap B.

As mentioned above, for TFTs including no low resistance conductive thin film, the minimum distance D between the adjacent oxide semiconductor thin film layers is equal to the gap B, whereas, for TFTs (e.g. TFT 500) including the low resistance conductive thin film, the minimum distance D between the oxide semiconductor thin film layers is equal to the sum of width A, gap B, and width A (width A+gap B+width A). In other words, in the TFTs (e.g. TFT 500) including the low resistance conductive thin film for improving the contact properties, the low resistance conductive thin film 110 forces the gap between the oxide semiconductor thin film layers to be wider, which results in difficulty in achieving a high integration of the TFTs.

SUMMARY OF THE INVENTION

Considering the above-mentioned problems, one object of the present invention is to decrease the distance D between oxide semiconductor thin film layers by eliminating the width A so as to increase a degree of integration of the thin film transistors.

The manufacturing method of the thin film transistor according to one aspect of the present invention includes forming a pair of source/drain electrodes (a source electrode and a drain electrode) on a substrate; forming low resistance conductive thin films, which are made of an oxide, on the source/drain electrodes; and forming an oxide semiconductor thin film layer, which functions as a channel, along the gap defined between the low resistance conductive thin films and on the upper surfaces of the low resistance conductive thin films. The low resistance conductive thin films and the oxide semiconductor thin film layer are etched so that side surfaces of the oxide semiconductor thin film layer and corresponding side surfaces of the low resistance conductive thin films coincide with each other in a channel width direction of the channel.

BRIEF DESCRIPTION OF THE DRAWINGS

Further features and advantages of the present invention will become apparent from the following detailed description, taken in combination with the accompanying drawings.

FIG. 1A is a cross-sectional view of the thin film transistor along line IA-IA in FIG. 1C; FIG. 1B is a plan view of the layout of the thin film transistor manufactured by the method according to the first embodiment after forming source/drain electrodes and low resistance conductive thin films; and FIG. 1C is a plan view of the layout of the thin film transistor manufactured by the method according to the first embodiment;

FIG. 2A is a cross-sectional view of the thin film transistor according to the first embodiment after forming the source/drain electrodes and the low resistance conductive thin films on the substrate; FIG. 2B is a cross-sectional view of the thin film transistor according to the first embodiment after coating the oxide semiconductor thin film layer; FIG. 2C is a cross-sectional view of the thin film transistor according to the first embodiment after performing etching; FIG. 2D is a cross-sectional view of the thin film transistor according to the first embodiment after laminating the gate insulating film and a gate electrode; and FIG. 2E is a cross-sectional view after laminating contact parts, external source/drain electrodes, and a display electrode;

FIG. 4A is a cross-sectional view of the thin film transistor according to the second embodiment after forming the source/drain electrodes, the low resistance conductive thin films and the oxide semiconductor thin film layer on the substrate; FIG. 4B is a cross-sectional view of the thin film transistor according to the second embodiment after forming the first insulating film; FIG. 4C is a cross-sectional view of the thin film transistor according to the second embodiment after performing etching; and FIG. 4D is a cross-sectional view of the thin film transistor according to the second embodiment after laminating the second gate insulating film and the gate electrode;

FIG. 6A is a cross-sectional view of the thin film transistor according to the third embodiment after forming the gate electrode and the gate insulating film on the substrate; FIG. 6B is a cross-sectional view of the thin film transistor according to the third embodiment after forming the source/drain electrodes, the low resistance conductive thin films, and the oxide semiconductor thin film layer; FIG. 6C is a cross-sectional view of the thin film transistor according to the third embodiment after performing etching; and FIG. 6D is a cross-sectional view after forming an overcoat insulating film;

FIG. 8A is a cross-sectional view of the thin film transistor according to the fourth embodiment after forming the gate electrode and the gate insulating film on the substrate; FIG. 8B is a cross-sectional view of the thin film transistor according to the fourth embodiment after forming the source/drain electrodes, the low resistance conductive thin films, the oxide semiconductor thin film layer, and the first overcoat insulating film; FIG. 8C is a cross-sectional view of the thin film transistor according to the fourth embodiment after performing etching; and FIG. 8D is a cross-sectional view of the thin film transistor according to the fourth embodiment after forming the second overcoat insulating film; and FIG. 9 shows one example of a conventional thin-film transistor.

DETAILED DESCRIPTION

Figure 1A:
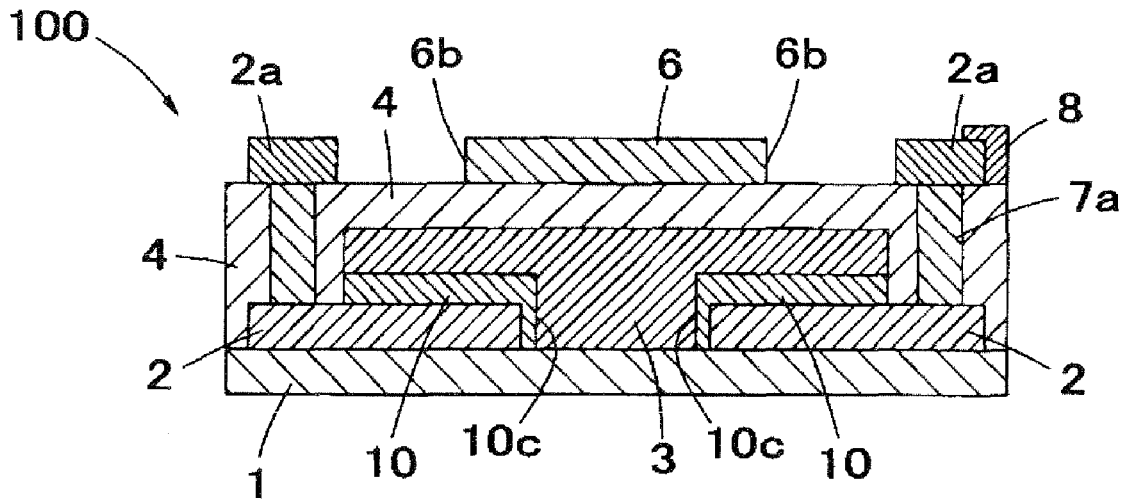
FIGS. 1A to 1C show the thin film transistor manufactured by a method of the first embodiment of the present invention.
Figure 1B:
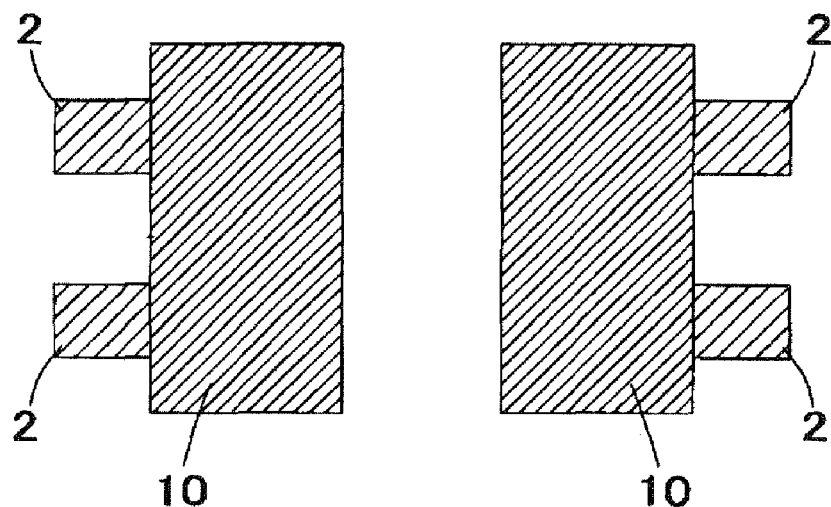
Figure 1C:
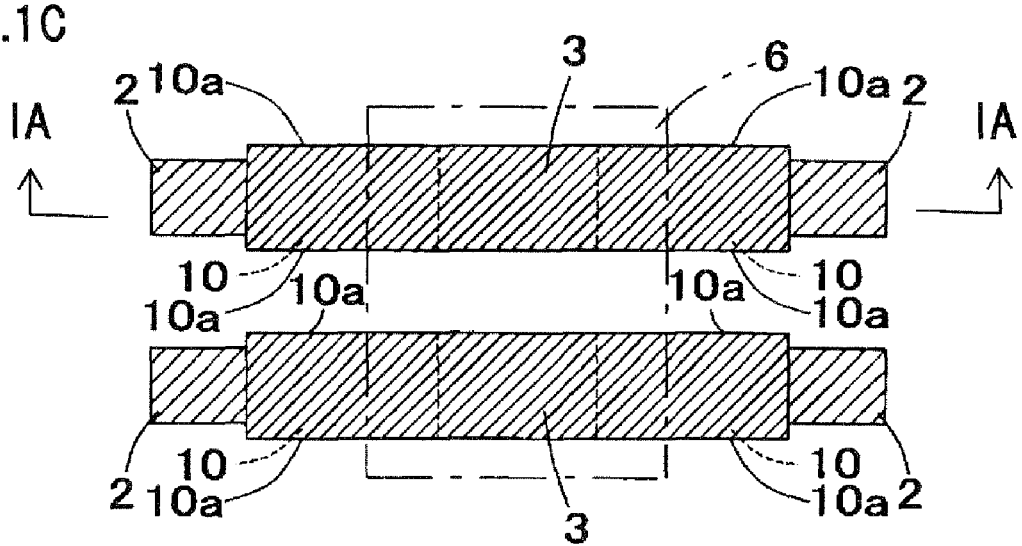

FIGS. 1A-1C are views of the TFT 100 manufactured by a method according to the first embodiment of the present invention. FIG. 1A is a cross-sectional view along line IA-IA of FIG. 1C. FIG. 1B shows the TFTs 100 at a stage of manufacturing after formation of the source/drain electrodes and low resistance conductive thin films and before coating the TFTs 100 with an oxide semiconductor thin film layer. In FIG. 1B a plurality (two in the figure) of the TFTs 100 are aligned in parallel for integration. FIG. 1C is a plan view for describing the subsequent processes. Hereinafter, the first embodiment of the present invention will be described referring mainly to FIG. 1A, as well as FIG. 1B and FIG. 1C.

"Channel length direction" as used herein refers to the direction perpendicular to the channel width. The channel length direction is the right-to-left direction in FIG. 1A. "Channel width direction" as used herein refers to the up-and-down direction in FIG. 1C.

A thin film transistor 100 manufactured by the method according to the first embodiment of the present invention includes a substrate 1, a pair of source/drain electrodes 2, a pair of low resistance conductive thin films 10, an oxide semiconductor thin film layer 3, a gate insulating film 4, a gate electrode 6, contact parts 7a, a pair of external source/drain electrodes 2a, and a display electrode 8, which are laminated in the order shown in FIG. 1A.

The thin film transistor 100, as shown in FIG. 1A, is formed on a substrate 1 made of glass (non-alkali glass primarily comprising $SiO_2$ and $Al_2O_3$). The material for the substrate 1 is not limited to glass, and other insulating materials, such as plastics covered with an insulator and metal foils covered with an insulator, are applicable to form the substrate 1 according to the present invention.

The pair of the source/drain electrodes 2 is laminated on the upper surface of the substrate 1. The source/drain electrodes 2 include a source electrode and a drain electrode that are spaced apart from each other.

The source/drain electrodes 2 are made of metal. Conductive oxides, such as indium tin oxide (ITO) and n+ZnO, which are generally used as source/drain electrodes, are preferably not used in the source/drain electrode 2 of the present invention because a conductive oxide such as ITO or n+ZnO would be etched when the oxide semiconductor thin film layer and low resistance conductive thin films are etched.

The length in the channel width direction (the up-and-down direction in FIG. 1C) of the source/drain electrodes 2 is preferably equal to or smaller than the length of the oxide semiconductor thin film layer 3 in the channel width direction. If the length of the source/drain electrodes 2 in the channel width direction is larger than the length of the oxide semiconductor thin film layer 3 in the channel width direction, it prevents high integration of the thin film transistors when a plurality of TFTs are integrated as shown in FIG. 1C.

The source/drain electrodes 2 may be formed as a monolayer of Ti, Cr, Ta, Mo, W, Al, Cu, and Ni or as a lamination of two or more of these materials, or as an alloy containing one or more of Ti, Cr, Ta, Mo, W, Al, Cu, Si and Ni. Specific examples of the alloy include, for example, TiW, TaW, MoW, MoSi, AlCu, AlSi, and NiSi.

The thickness of the source/drain electrodes 2 may be, for example, though not limited to, 30 to 150 nm (in the height direction of the layer of the source/drain electrodes 2, corresponding to the up-and-down direction of FIG. 1).

The low resistance conductive thin films 10 are formed on the pair of source/drain electrodes 2 in the manner shown in FIG. 1B. The low resistance conductive thin films 10 may be, for example, a thin film primarily comprising indium tin oxide (ITO); or zinc oxide doped with gallium (Ga) or aluminum (Al); or the like. If the oxide semiconductor thin film layer 3 primarily comprises zinc oxide, the low resistance conductive thin films 10 may be made of intrinsic zinc oxide (ZnO) with no impurity introduced. When the low resistance conductive thin films 10 are made of intrinsic zinc oxide with no impurities introduced, the zinc oxide in the low resistance conductive thin films 10 must have larger crystal grain size than the zinc oxide in the oxide semiconductor thin film layer 3. The crystal grain size of the zinc oxide may be adjusted by applying high frequency bias during film formation or by changing film forming conditions during the film formation.

The resistance of the low resistance conductive thin films 10 is higher than the resistance of the source/drain electrodes 2 and lower than the resistance of the oxide semiconductor thin film layer 3. Therefore, the contact properties between the source/drain electrodes 2 and the oxide semiconductor thin film layer 3 are improved by using the low resistance conductive thin films 10.

The oxide semiconductor thin film layer 3, which is formed by an oxide semiconductor, is arranged so that a channel is formed on each of the low resistance conductive thin films 10 and between the pair of the source/drain electrodes 2. The oxide semiconductor thin film layer 3 may be an oxide semiconductor primarily comprising zinc oxide. As used herein, an oxide semiconductor primarily comprising zinc oxide includes: intrinsic zinc oxide; zinc oxide doped with a p-type dopant such as Li, Na, N, C; zinc oxide doped with an n-type dopant such as B, Al, Ga, In; and zinc oxide doped with Mg, Be. The oxide semiconductor thin film layer 3 may be an amorphous oxide semiconductor, such as an IGZO (In—Ga—Zn—O).

The oxide semiconductor thin film layer 3 covers the entire upper surfaces of each of the low resistance conductive thin films 10. At least side surfaces 10a (see FIG. 1C) of the low resistance conductive thin films 10, extending in the channel length direction, are positioned coincident with the side surfaces of the oxide semiconductor thin film layer 3.

The thickness of the oxide semiconductor thin film layer 3 may be, for example, though not limited to, about 25 to 200 nm, and preferably about 50 to 100 nm (in the height direction of the layer of the source/drain electrodes 2, corresponding to the up-and-down direction of FIG. 1).

Figure 9A:
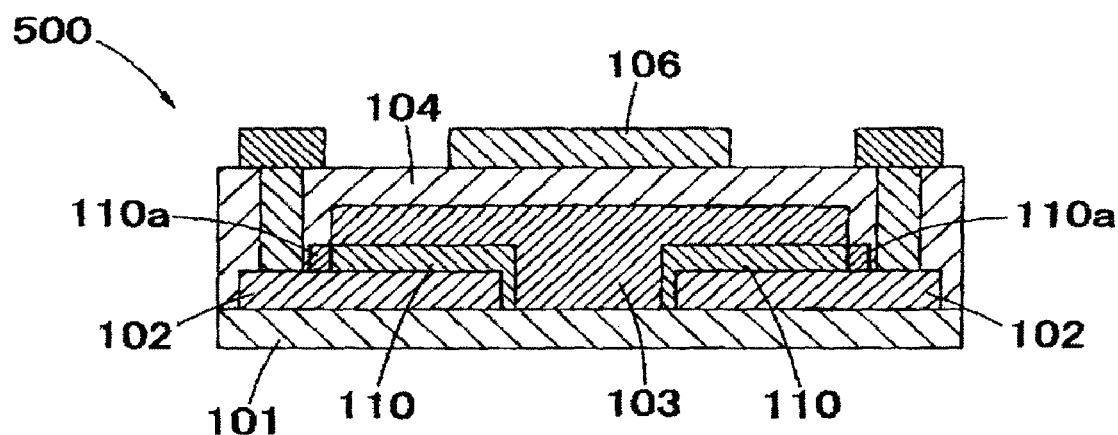
FIG. 9A is a cross-sectional view along line IXA-IXA in FIG. 9B.
Figure 9B:
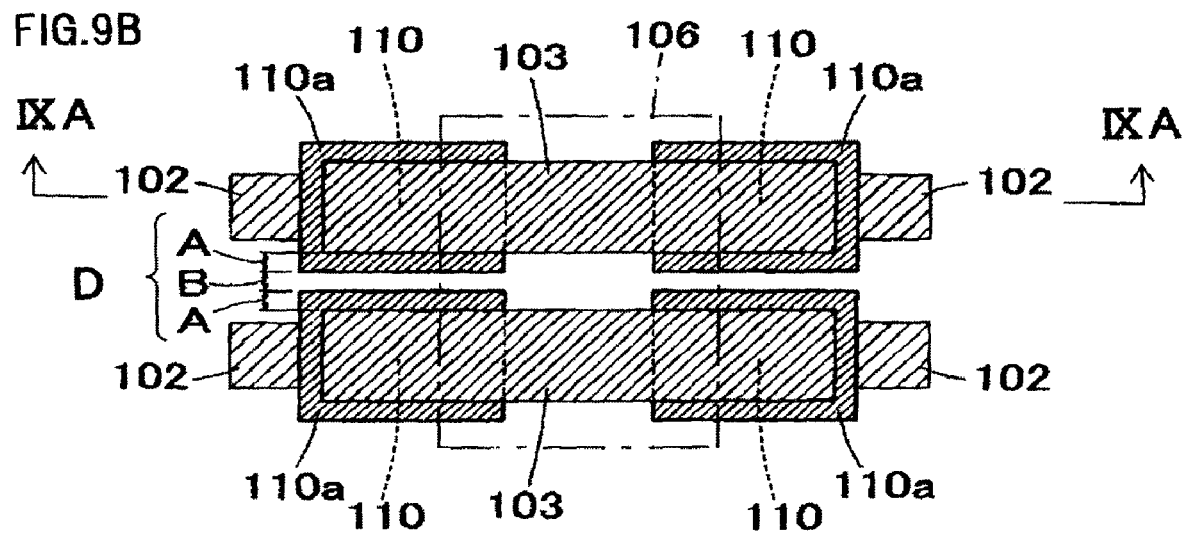
FIG. 9B is a plan view of the layout of the conventional thin film transistor of FIG. 9A.

In the present invention, the low resistance conductive thin films 10 and the oxide semiconductor thin film layer 3 are formed in a self-aligning manner in the channel width direction, as shown in FIG. 1C, so that the low resistance conductive thin films 10 below the oxide semiconductor thin film layer 3 are not seen when viewed from above. In other words, the entire upper surfaces of the low resistance conductive thin films 10 are coated with the oxide semiconductor thin film layer 3. Consequently, the space provided between the adjacent oxide semiconductor thin films 3 according to the accuracy of mask alignment between the low resistance conductive thin films 10 and the oxide semiconductor thin film layer 3 (width A described above with respect to FIG. 9B) is not necessary. Therefore, it is possible to shorten the distance (spacing) between the low resistance conductive thin films 10 to the minimum line width of the aligner (gap B described above with respect to FIG. 9B) and this enables high integration of the thin film transistors 100.

A specific comparison between the conventional TFT 500 (see FIG. 9) and the TFT 100 manufactured by the method according to the first embodiment of the present invention is set forth below.

As mentioned above, the TFT 500 is fabricated by patterning the low resistance conductive thin films 110 on each TFT and then forming the oxide semiconductor thin film layers 103. Consequently, the distance (spacing) between the oxide semiconductor thin film layers 103 is defined as gap B+2× width A (here the gap B is the width of an area determined by the minimum resolution, and the width A is the width of an area determined by the alignment accuracy of the photolithography of the low resistance conductive thin film 110 and the oxide semiconductor thin film layer 103). As explained above with respect to FIG. 9B, when a conventional aligner for an LCD is used, the width A determined by the alignment accuracy, is about 1.5 μm, and the gap B determined by the minimum resolution is about 4.0 μm. Therefore, in the conventional TFT 500, the distance D between the oxide semiconductor thin film layers 103 is approximately 7.0 μm (1.5 μm+4.0 μm+1.5 μm) (see FIG. 9B).

On the other hand, in manufacturing the TFT 100 by the method according to the present invention, the low resistance conductive thin films 10 are formed on multiple pairs of the source/drain electrodes 2 (two pairs in the example shown in FIG. 1B) of the TFTs 100 as shown in FIG. 1B. Then the oxide semiconductor thin film layer 3 is coated on the low resistance conductive thin films 10. The oxide semiconductor thin film layer 3 and the low resistance conductive thin films 10 are subsequently etched together in a self-aligning manner so that the side surfaces 10a of the low resistance conductive thin films 10 have an identical shape to the side surfaces of the oxide semiconductor thin film layer 3, so that the side surfaces of the low resistance conductive thin films 10 and the oxide semiconductor thin film layer 3 are positioned coincident with each other. Therefore, although the width A, which is determined by the alignment accuracy, is necessary in the conventional TFT 500, the width A is not necessary in the TFT 100 of the present invention. The distance between the adjacent oxide semiconductor thin film layers 3 of the TFT 100 may be reduced to be equal to the gap B 4.0 μm, which is determined by the minimum resolution. Consequently, the TFT 100 according to the present invention enables nearly twice as high integration as the conventional TFT 500.

The gate insulating film 4 is formed so as to cover the upper surface and the side surfaces of the oxide semiconductor thin film layer 3.

The gate insulating film 4 may be a silicon oxide ($SiO_x$) film, a silicon oxide nitride (SiON) film, a silicon nitride ($SiN_x$) film, or a silicon nitride ($SiN_x$) film that is doped with oxygen using oxygen or a compound containing oxygen. Preferably, the gate insulating film 4 is formed by a silicon nitride ($SiN_2$) film that is doped with oxygen using oxygen or compound (e.g. $N_2O$) containing oxygen. Such a doped silicon nitride film has a higher dielectric constant than silicon oxide compounds ($SiO_x$) or silicon oxide nitride (SiON). Therefore, if the TFT 100 has a gate insulating film 4 made of a $SiN_x$ film doped with oxygen, the gate insulating film has a high dielectric constant and an excellent protecting effect on the oxide semiconductor thin film layer 3.

The gate electrode 6 is formed on the gate insulating film 4. The gate electrode 6 is configured to control electron density in the oxide semiconductor thin film layer 3 according to the gate voltages applied to the thin film transistor.

The gate electrode 6 is made of a metal film such as films comprising Cr or Ti.

Along the channel length direction, the outer ends 6b of the gate electrode 6 are positioned outside the inner ends 10c of the low resistance conductive thin films 10.

Each of the external source/drain electrodes 2a is connected to the corresponding source/drain electrodes 2 via the contact part 7a.

The display electrode 8 is configured to apply a voltage to a liquid crystal in a liquid crystal display via the thin film transistor. The display electrode 8 is formed by a conductive oxide thin film such as an indium tin oxide (ITO) thin film and the like because it must have high transmittance with respect to visible light.

Referring to FIGS. 2A-2E, a manufacturing method of a thin film transistor (TFT) according to the first embodiment of the present invention will be described.

Figure 2A:
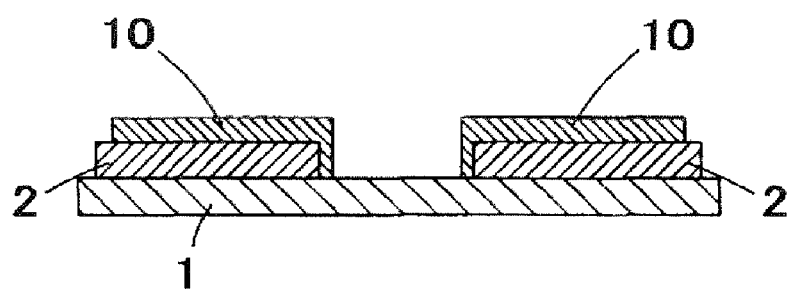
FIGS. 2A to 2E are cross-sectional views showing steps of the manufacturing method of the thin film transistor according to the first embodiment of the present invention.

First, as shown in FIG. 2A, the source/drain electrodes 2 are formed on the substrate 1. In the case a plurality of TFTs are arranged in parallel on the substrate 1, the corresponding number of pairs of the source/drain electrodes 2 are patterned, as shown in FIG. 1B (which shows two pairs of source/drain electrodes 2 corresponding to two TFTs). Next, the low resistance conductive thin film 10 having, for example, a 10 to 100 nm thickness, is coated on the source/drain electrodes 2 and the substrate 1 by means of magnetron sputtering. The low resistance conductive thin film 10 is then patterned as shown in FIG. 1B. In the patterning, the low resistance conductive thin film 10 is etched in an area (channel-corresponding area) that corresponds to the gap extending between the source electrodes and the drain electrodes. The resultant low resistance conductive thin film 10 is separated into a first low resistance conductive thin film piece and a second low resistance conductive thin film piece. The first low resistance conductive thin film piece bridges one of the source electrodes and the drain electrodes of the plurality of the TFTs (e.g., the source electrodes), while the second low resistance conductive thin film piece bridges the other of the source electrodes and the drain electrodes of the plurality of the TFTs (e.g., the drain electrodes).

At this stage, the low resistance conductive thin films 10 are shaped to extend longer in the channel length direction than the final shape of the low resistance conductive thin films 10. The outer ends of the low resistance conductive thin films 10 are then etched together with the oxide semiconductor thin film layer 3 that is formed thereon so that the outer ends of the low resistance conductive thin films 10 and the oxide semiconductor thin film layer 3 have an identical shape, as described below.

Figure 2B:
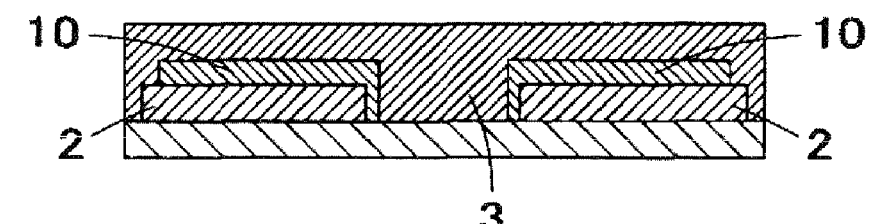

As shown in FIG. 2B, the oxide semiconductor thin film layer 3 is coated on all the exposed surfaces of the substrate 1, the source/drain electrodes 2, and the low resistance conductive thin films 10, with a thickness, for example, of about 50 to 100 nm.

After being coated with the oxide semiconductor thin film layer 3, the low resistance conductive thin films 10 are etched together with the oxide semiconductor thin film layer 3.

It is preferable to perform the etching treatment by means of dry etching. Wet etching is also applicable but not preferable because the wet-etched edges form a nonplanar surface, which results in insufficient step coverage of the gate insulating film 4 to be formed on these layers and in increasing leak current.

If the low resistance conductive thin film 10 is made of zinc oxide doped with gallium (Ga) or aluminum (A) or intrinsic zinc oxide (ZnO) with no impurity introduced, gases such as $CH_4$, $CF_4$, $CHF_3$, $Cl_2$, or gas containing one of these gases and oxygen may be used in the dry etching. On the other hand, if the low resistance conductive thin film 10 is made of indium tin oxide (ITO), gases such as $CH_4$ or mixture of $CH_4$ and oxygen may be used.

Figure 2C:
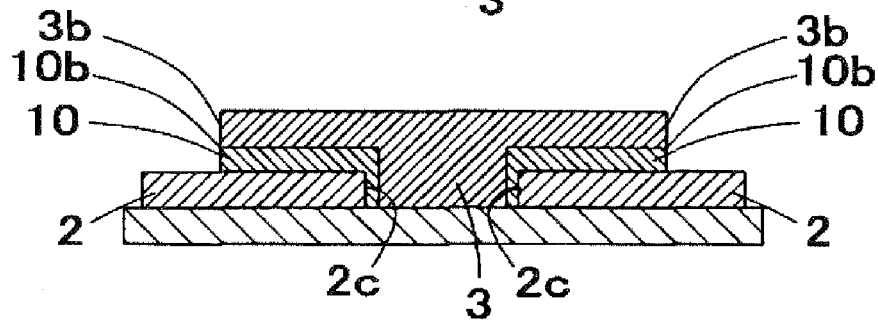

For example, conventional reactive ion etching (RIE method) or inductively coupled plasma (ICP) etching may be used in the dry etching process of the present invention. The low resistance conductive thin films 10 and the oxide semiconductor thin film layer 3 are etched together. As a result, the outer ends 10b of each of the low resistance conductive thin films 10 and the outer ends 3b of the oxide semiconductor thin film layer 3 are positioned coincident with each other along the channel length direction, as shown in FIG. 2C. Also, the low resistance conductive thin films 10 and the oxide semiconductor thin film layer 3 are formed to have an identical shape in the channel width direction. The low resistance conductive thin films 10 and the oxide semiconductor thin film layer 3 are slightly longer than the source/drain electrodes 2, as shown in FIG. 1C.

FIG. 2C is a sectional view illustrating the lamination of the substrate 1, the source/drain electrodes 2, the low resistance conductive thin films 10, and the oxide semiconductor thin film layer 3 after performing dry etching as described above. In the manufacturing stage shown in FIG. 2C, etched surfaces (3b and 10b in FIG. 2C) must be formed outside the respective inner ends 2c of the source/drain electrodes 2, along the channel length direction. The source/drain electrodes 2 subsequently serve as etching stoppers (since the source/drain electrodes 2 are made of metal, as described above) so that only the low resistance conductive thin films 10 and the oxide semiconductor thin film layers 3 are etched.

Next, a gate insulating film 4 is formed on the oxide semiconductor thin film layer 3 using a technique and under a condition(s) that do not reduce the resistance of the semiconductor thin film layer 3.

The gate insulating film 4 may be a silicon-based-insulating film such as a silicon oxide ($SiO_x$) film; a silicon oxide nitride (SiON) film; a silicon nitride ($SiN_x$) film; or a silicon nitride ($SiN_x$) film doped with oxygen using oxygen or a compound containing oxygen as a constituent element. Among these, a film of $SiN_x$ doped with oxygen using oxygen or a compound (e.g. $N_2O$) including oxygen or the like is desirable because the constituents of such a film have a high dielectric constant as well as an excellent effect of preventing reduction and removal of oxygen and zinc from the oxide semiconductor thin film layer 3.

The gate insulating film 4 may be a 100 to 300 nm thick $SiN_x$ film created by means of a plasma-enhanced chemical vapor deposition (PCVD) under a condition, for example, where a substrate temperature is 250° C. and mixed gas containing $NH_3$ and $SiH_4$ is used at a flow rate ratio of 4 to 1.

Figure 2D:
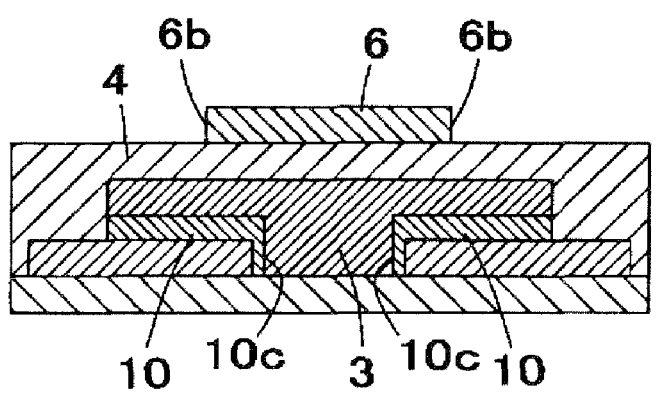

As shown in FIG. 2D, a gate electrode 6 is disposed over the gate insulating film 4 so that both of the outer ends 6b of the gate electrode 6 are positioned outside the respective inner ends 10c of the low resistance conductive thin films 10.

Figure 2E:
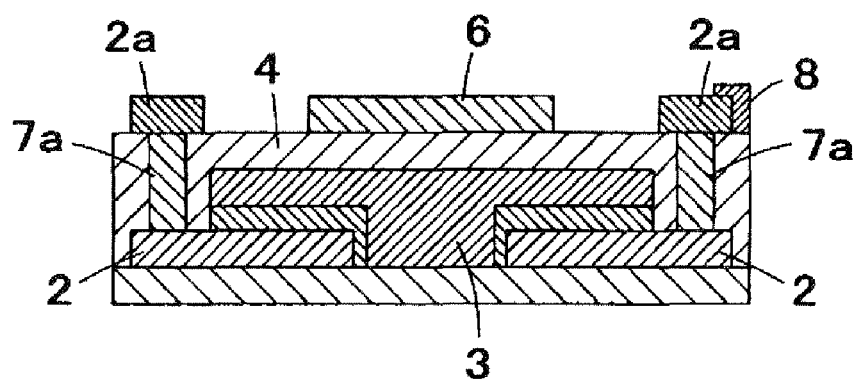

As shown in FIG. 2E, contact holes are opened in the gate insulating film 4 to expose portions of the source/drain electrodes 2 by means of photolithography. The external source/drain electrodes 2a are respectively connected to the source/drain electrodes 2 through the contact holes via contact parts 7a. In the final step to form a TFT array, a display electrode 8 made of indium tin oxide (ITO) and the like is formed.

Figure 3:
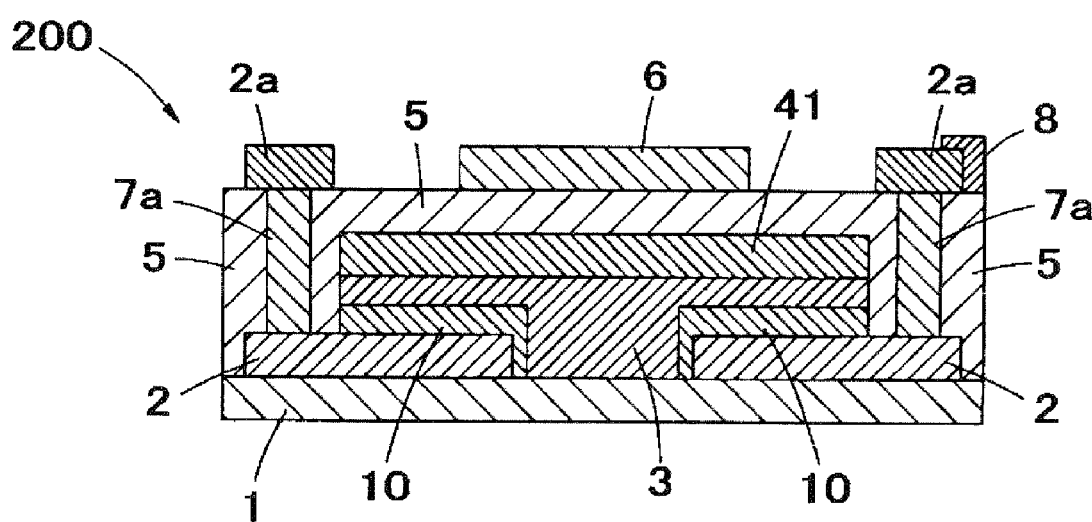
FIG. 3 is a cross-sectional view of the thin film transistor manufactured by a method according to the second embodiment of the present invention.

FIG. 3 is a cross-sectional view showing the structure of the thin film transistor 200 manufactured by a method according to the second embodiment of the present invention. The TFT 200 according to the second embodiment has some similar structures to the TFT 100 according to the first embodiment. These structures are denoted by the same reference numerals. However, in place of the gate insulating film 4 of the TFT 100 according to the first embodiment, the TFT 200 according to the second embodiment includes a first gate insulating film and a second gate insulating film, which are denoted as the first gate insulating film 41 and the second gate insulating film 5.

The first gate insulating film 41 is formed to cover only the upper surface of the oxide semiconductor thin film layer 3. The first gate insulating film 41 is provided as a part of the gate insulating film. The first gate insulating film 41 serves as a protective film configured to protect the oxide semiconductor thin film layer 3 from the resist stripper used in the manufacturing process.

The second gate insulating film 5 is laminated to cover the side surfaces of the low resistance conductive thin films 10 and the oxide semiconductor thin film layer 3 as well as the entire upper surfaces of the first gate insulating film 41. Since the upper surface of the oxide semiconductor thin film layer 3 is covered with the first gate insulating film 41, the coverage on all the exposed surfaces of the semiconductor thin film layer 3 is then completed.

The first gate insulating film 41 and the second gate insulating film 5 may be a silicon oxide ($SiO_x$) film; a silicon oxide nitride (SiON) film; a silicon nitride ($SiN_x$) film; or a silicon nitride ($SiN_x$) film doped with oxygen using oxygen or a compound containing oxygen as a constituent element. Preferably the first gate insulating film 41 and the second gate insulating film 5 are formed by a $SiN_x$ film doped with oxygen using oxygen or a compound (e.g. $N_2O$) containing oxygen. Such a doped $SiN_x$ film has a higher dielectric constant than silicon oxide compounds ($SiO_x$) or silicon oxide nitride (SiON).

The first gate insulating film 41 and the second gate insulating film 5 are formed by means of a plasma-enhanced chemical vapor deposition (PCVD) process. It is desirable to perform the film formation by the plasma-enhanced chemical vapor deposition (PCVD) process at a substrate temperature of 250° C. or below. In this temperature range, the reduction of the oxide semiconductor thin film layer or removal of oxygen and zinc does not occur.

Hereinafter, a manufacturing method of a thin film transistor (TFT) according to the second embodiment of the present invention will be explained referring to FIGS. 4A-4D.

Figure 4A:
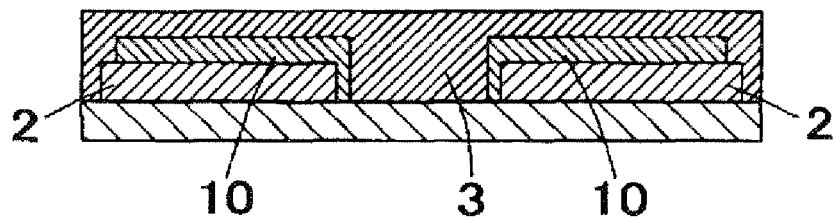
FIGS. 4A to 4D are cross-sectional views showing steps of the manufacturing method of the thin film transistor according to the second embodiment of the present invention.

First, as shown in FIG. 4A, source/drain electrodes 2 and low resistance conductive thin films 10 are formed on a substrate 1 as in the first embodiment of the present invention. The low resistance conductive thin films 10 are formed over the source/drain electrodes 2 of a plurality of TFTs 200. An oxide semiconductor thin film layer 3 is formed on all the exposed surfaces of the substrate 1, the source/drain electrodes 2, and the low resistance conductive thin films 10.

Figure 4B:
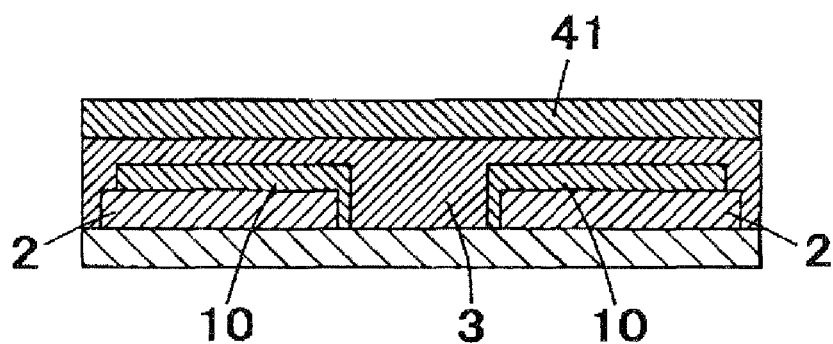

Next, as shown in FIG. 4B, a first gate insulating film 41 is formed on the oxide semiconductor thin film layer 3 using a technique and under a condition(s) that do not reduce the resistance of the oxide semiconductor thin film layer 3. Then, a photo-resist is coated on the first gate insulating film 41 and patterned. Using the patterned photo-resist as a mask, the first gate insulating film 41, the low resistance conductive thin films 10, and the oxide semiconductor thin film layer 3 are simultaneously etched. Preferably, dry etching is used in the etching process because the dry-etched edges are positioned coincident with each other. Thus leakage current resulting from insufficient step coverage is suppressed after the first gate insulating film 41 is formed.

As in the first embodiment of the present invention, if the low resistance conductive thin films 10 are made of zinc oxide doped with gallium (Ga) or aluminum (Al); or intrinsic zinc oxide (ZnO) with no impurity introduced, gases such as $CH_4$, $CF_4$, $CHF_3$, $Cl_2$, or gas containing one of these gases and oxygen may be used in the dry etching. On the other hand, if the low resistance conductive thin films 10 are made of indium tin oxide (ITO), gases such as $CH_4$ or a mixture of $CH_4$ and oxygen may be used. For example, common reactive ion etching (RIE method) or inductively coupled plasma (ICP) etching may be used in the dry etching process.

Figure 4C:
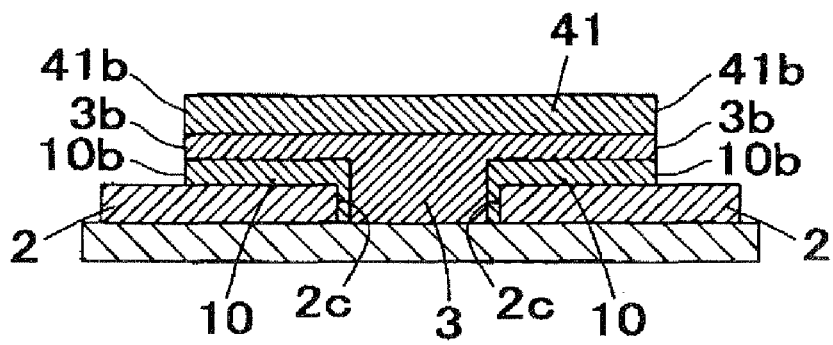

FIG. 4C shows a cross-section of a lamination comprising the oxide semiconductor thin film layer 3, the low resistance conductive thin films 10, and the first gate insulating film 41 after etching and removing the photo-resist. Etched surfaces 3b, etched surfaces 10b, and etched surfaces 41b of the layers are positioned coincident with each other. Consequently, sufficient step coverage is maintained and leakage current is suppressed, after a second gate insulating film 5 is formed.

The etched surfaces must be formed outside the respective inner ends 2c of the source/drain electrodes 2 in the channel length direction. Thus, only the first gate insulating film 41, the low resistance conductive thin films 10 and the oxide semiconductor thin film layer 3 are etched.

The first gate insulating film 41 not only forms an interface with the oxide semiconductor thin film layer 3 but also protects the oxide semiconductor thin film layer 3 while an active region of the TFT is patterned. If the first gate insulating film 41 is not present, while the resist stripper is used to remove photo-resist after the patterning of the active layer, the resist stripper contacts with the surface of the oxide semiconductor thin film layer 3. The resist stripper generally etches and roughens the surface and crystal grain boundary of the oxide semiconductor thin film layer 3. However, if the first gate insulating film 41 is present on the surface of the oxide semiconductor thin film layer 3, the first gate insulating film 41 functions as a protective film against various kinds of liquid chemicals such as a resist stripper used in a photo-lithography process. The first gate insulating film 41 therefore prevents the surface of the oxide semiconductor thin film layer 3 from roughening. Thus, sufficient interface properties between the oxide semiconductor thin film layer 3 and the gate insulating film are maintained.

Figure 4D:
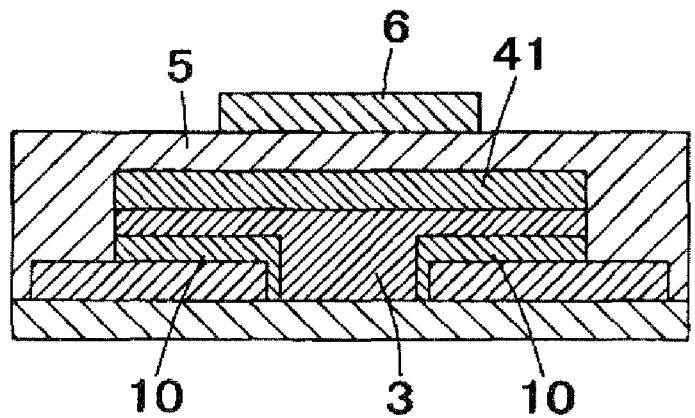

Referring to FIG. 4D, after the TFT active layer region is patterned, a second gate insulating film 5 is formed on all the exposed surfaces of substrate 1, the source/drain electrodes 2, the oxide semiconductor thin film layer 3, the low resistance conductive thin films 10, and the first gate insulating film 41. Then contact holes are opened in the gate insulating film 5 to expose portions of the source/drain electrodes 2. In this embodiment, it is desirable to form the second gate insulating film 5 under similar conditions to the first gate insulating film 41.

A gate electrode 6 made of a metal film is formed on the second gate insulating film 5. After that, external source/drain electrodes 2a are formed with the same material as the gate electrode 6. The external source/drain electrodes 2a are connected to the source/drain electrodes 2 via contact parts 7a. A display electrode 8 is formed in the final step to form a TFT array of the second embodiment of the present invention (see the TFT shown in FIG. 3).

Hereinafter, the thin film transistor manufactured by a method according to the third embodiment of the present invention will be described with reference to FIG. 5.

Figure 5:
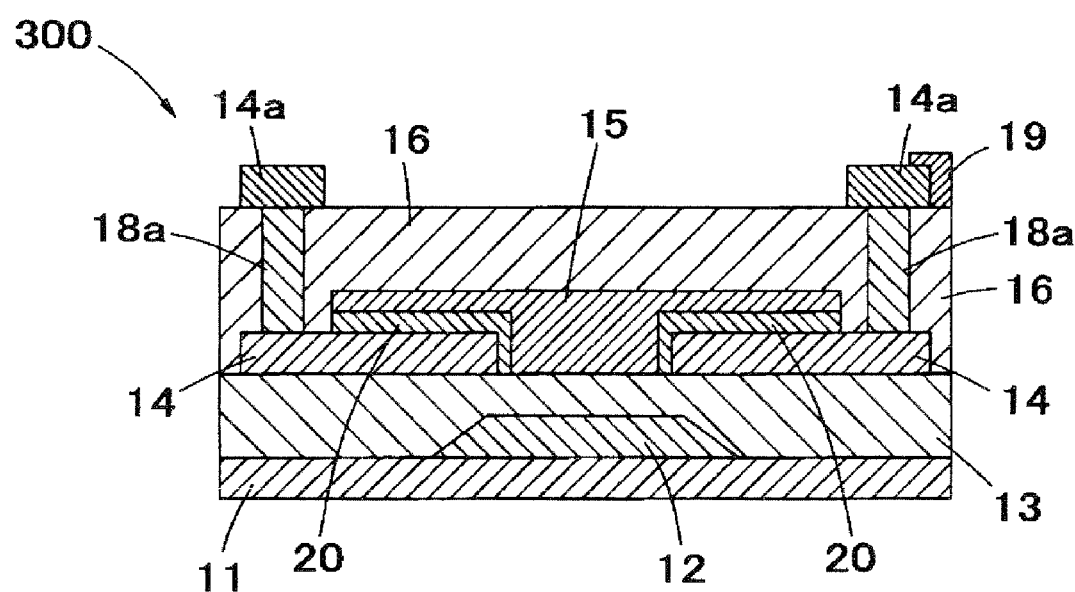
FIG. 5 is a cross-sectional view of the thin film transistor manufactured by a method according to the third embodiment of the present invention.

FIG. 5 is a cross-sectional view showing the structure of a thin film transistor 300 manufactured by the method according to the third embodiment of the present invention. The thin film transistor 300 includes a substrate 11, a gate electrode 12, a gate insulating film 13, source/drain electrodes 14, low resistance conductive thin films 20, an oxide semiconductor thin film layer 15, an overcoat insulating film 16, external source/drain electrodes 14a, contact parts 18a, and a display electrode 19. The TFT 300 is a bottom gate type TFT in which these layers are laminated in the order shown in FIG. 5.

As shown in FIG. 5, the thin film transistor 300 is formed on the substrate 11. The gate electrode 12 is formed on the substrate 11. In this step, the gate electrode 12 is disposed over the substrate 11 so that the outer ends of the gate electrode 12 will be positioned outside the inner ends of the low resistance conductive thin films 20 (described below), along the channel length direction.

The gate insulating film 13 is laminated on the entire upper surface of the substrate 11 so as to cover the gate electrode 12.

The source/drain electrodes 14 are laminated on the gate insulating film 13. The source/drain electrodes 14 are made of metal. In general, source/drain electrodes are formed with conductive oxides such as indium tin oxide (ITO) and n+ZnO. In the present invention, however, the conductive oxides are not preferable because the source/drain electrodes made of the conductive oxides are etched when the oxide semiconductor thin film layer and low resistance conductive thin films are etched.

The length in the channel width direction of the source/drain electrodes 14 is preferably equal to or smaller than the length of the oxide semiconductor thin film layer 15 in the channel width direction. If the length in the channel width direction of the source/drain electrodes 14 is larger than the length of the source drain electrodes in the channel width direction, it prevents high integration of the thin film transistors when a plurality of TFTs are integrated.

The low resistance conductive thin films 20 are formed on the source/drain electrodes 14. The low resistance conductive thin films 20 may be, for example, a thin film primarily comprising indium tin oxide (ITO); or the zinc oxide doped with gallium (Ga) or aluminum (Al); or the like. If the oxide semiconductor thin film layer 15 primarily comprises zinc oxide, the low resistance conductive thin films 20 may be made of intrinsic zinc oxide (ZnO) with no impurity introduced. When the low resistance conductive thin films 10 are made of intrinsic zinc oxide with no impurities introduced, the zinc oxide in the low resistance conductive thin films 20 must have larger crystal grain size than the zinc oxide in the oxide semiconductor thin film layer 15.

The resistance of the low resistance conductive thin films 20 is higher than the resistance of the source/drain electrodes 14 and lower than the resistance of the oxide semiconductor thin film layer 15. Therefore, the contact properties between each of the source/drain electrodes 14 and the oxide semiconductor thin film layer 15 are improved by using the low resistance conductive thin films 20.

The oxide semiconductor thin film layer 15 is arranged so that a channel is formed on each of the low resistance conductive thin films 20 and between the electrodes of the low resistance conductive thin films 20. The oxide semiconductor thin film layer 15 may be made of, for example, an oxide semiconductor primarily comprising zinc oxide or an IGZO as the oxide semiconductor thin film layer 3 described above.

The oxide semiconductor thin film layer 15 covers the entire upper surface of the low resistance conductive thin films 20. At least side surfaces of the low resistance conductive thin films 20 have an identical shape to the side surfaces of the oxide semiconductor thin film layer 15 so that they form a planar surface.

Consequently, the space provided between the adjacent oxide semiconductor thin films 15 according to the accuracy of mask alignment of the low resistance conductive thin films 20 and the oxide semiconductor thin film layer 15 (i.e., a space corresponding to width A described above with respect to FIG. 9B) is not necessary. Therefore, it is possible to shorten the distance (spacing) between the low resistance conductive thin films 20 to the minimum line width of the aligner (i.e., the gap B described above with respect to FIG. 9B), which enables high integration of the thin film transistors 300.

The overcoat insulating film 16 is formed so as to cover the upper surface and side surfaces of the oxide semiconductor thin film layer 15. The external source/drain electrodes 14a are formed so as to be connected to the source/drain electrodes 14 via the contact parts 18a in the contact holes opened in the overcoat insulating film 16.

The display electrode 19 is configured to apply a voltage to a liquid crystal in a liquid crystal display via the thin film transistor. The display electrode 19 is formed by a conductive oxide thin film such as an indium tin oxide (ITO) thin film and the like because it must have high transmittance with respect to visible light.

Referring to FIGS. 6A-6D, a manufacturing method of the bottom gate type TFT according to the third embodiment of the present invention will be described below.

Figure 6A:
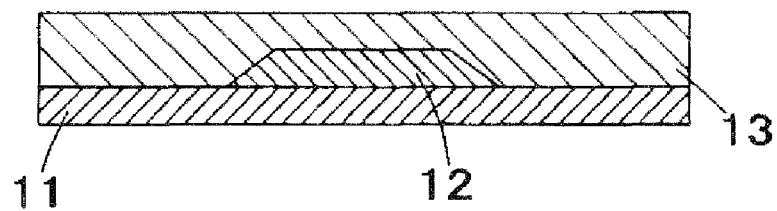
FIGS. 6A to 6D are cross-sectional views showing steps of the manufacturing method of the thin film transistor according to the third embodiment of the present invention.

As shown in FIG. 6A, a gate electrode 12 is formed on a substrate 11 made of, for example, glass. Then, a gate insulating film 13 is formed on the entire upper surface of the substrate 11 so as to cover the gate electrode 12. Although the method for forming the gate insulating film 11 is not limited especially, it is preferable to use a plasma-enhanced chemical vapor deposition (PCVD) process that enables film formation on a substrate having a large area.

Figure 6B:
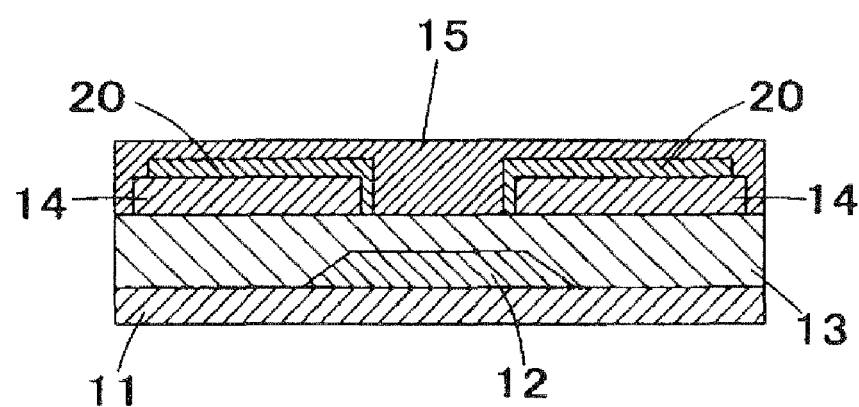

Referring to FIG. 6B, after the gate insulating film 13 is formed, a metal film is formed on the entire upper surface of the gate insulating film 13. The metal film is then subjected to photolithography to form the source/drain electrodes 14. After that, a low resistance conductive thin film 20 having a thickness of, for example, about 10 to 100 nm, is formed on the source/drain electrodes 14 by means of a magnetron sputtering process. The low resistance conductive thin film 20 is then patterned to bridge the source/drain electrodes 14 of a plurality of TFTs. More specifically, in the patterning, the low resistance conductive thin film 20 is etched in an area (channel-corresponding area) that corresponds to the gap extending between the source electrodes and the drain electrodes. The resultant low resistance conductive thin films 20 are separated into a first low resistance conductive thin film piece and a second low resistance conductive thin film piece. The first low resistance conductive thin film piece bridges, for example, the source electrodes of the plurality of the TFTs, while the second low resistance conductive thin film piece bridges, for example, the drain electrodes of the plurality of the TFTs. At this stage, the low resistance conductive thin films 20 are shaped to extend longer in the channel length direction than the final shape of the low resistance conductive thin films 20. The oxide semiconductor thin film layer 15 is then coated on the low resistance conductive thin films 20, as shown in FIG. 6B.

A photo-resist is coated on the upper surface of the oxide semiconductor thin film layer 15 and patterned. Using the patterned photo-resist as a mask, the low resistance conductive thin films 20 and the oxide semiconductor thin film layer 15 are simultaneously etched. Preferably, dry etching is used in the etching process because the dry-etched edges form a planar surface. Thus, leakage current resulting from insufficient step coverage is suppressed after an overcoat insulating film 16 is formed.

If the low resistance conductive thin film 20 is made of zinc oxide doped with gallium (Ga) or aluminum (Al), or intrinsic zinc oxide (ZnO) with no impurity introduced, gases such as $CH_4$, $CF_4$, $CHF_3$, $Cl_2$, or gas containing one of these gases and oxygen may be used in the dry etching. On the other hand, if the low resistance conductive thin film 10 is made of indium tin oxide (ITO), gases such as $CH_4$ or a mixture of $CH_4$ and oxygen may be used. For example, common reactive ion etching (RIE method) or inductively coupled plasma (ICP) etching may be used in the dry etching process of the present invention.

Figure 6C:
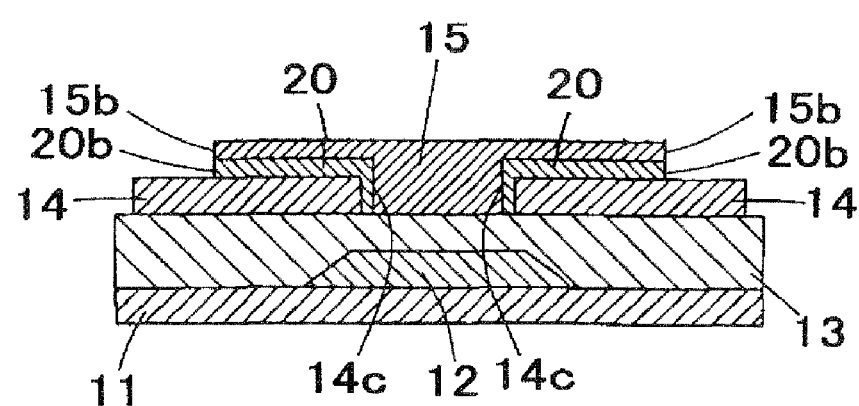

FIG. 6C is a cross-sectional view of the TFT 300 after performing dry etching. At this stage, etched surfaces 15b of the oxide semiconductor thin film layer 15 and etched surfaces 20b of the low resistance conductive thin films 20 must be located outside respective inner ends 14c of the source/drain electrodes 14 in the channel length direction. The source/drain electrodes 14 subsequently serve as etching stoppers so that only the low resistance conductive thin films 20 and the oxide semiconductor thin film layer 15 are etched.

Figure 6D:
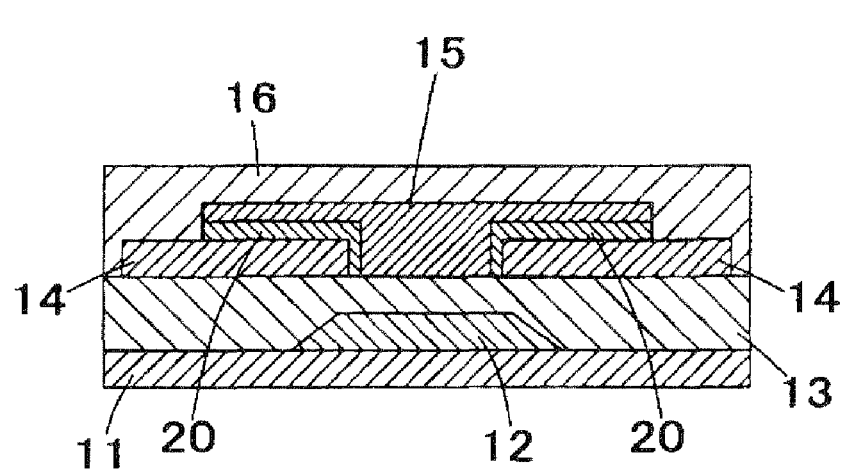

After the patterning of the oxide semiconductor thin film layer 15, the overcoat insulating film 16 is formed to cover all the exposed surfaces of the oxide semiconductor thin film layer 15, as shown in FIG. 6D.

The overcoat insulating film 16 may be a silicon oxide ($SiO_x$) film; a silicon oxide nitride (SiON) film; a silicon nitride ($SiN_x$) film; or a silicon nitride ($SiN_x$) film doped with oxygen using oxygen or a compound containing oxygen as a constituent element. Preferably, the overcoat insulating film 16 is formed with a $SiN_x$ film that is doped with oxygen using oxygen or a compound (e.g. $N_2O$) containing oxygen. Such a doped $SiN_x$ film has a higher dielectric constant than silicon oxide compounds ($SiO_x$) or silicon oxide nitride (SiON).

The overcoat insulating film 16 is formed by means of a plasma-enhanced chemical vapor deposition (PCVD) process.

After forming the overcoat insulating film 16, external source/drain electrodes 14a are formed. The external source/drain electrodes 14a are connected to the source/drain electrodes 14 via contact parts 18a. A display electrode 19 is formed in the final step to form a TFT array of the third embodiment of the present invention (see the TFT shown in FIG. 5).

Finally, a manufacturing method of the fourth embodiment of the present invention will be described.

Figure 7:
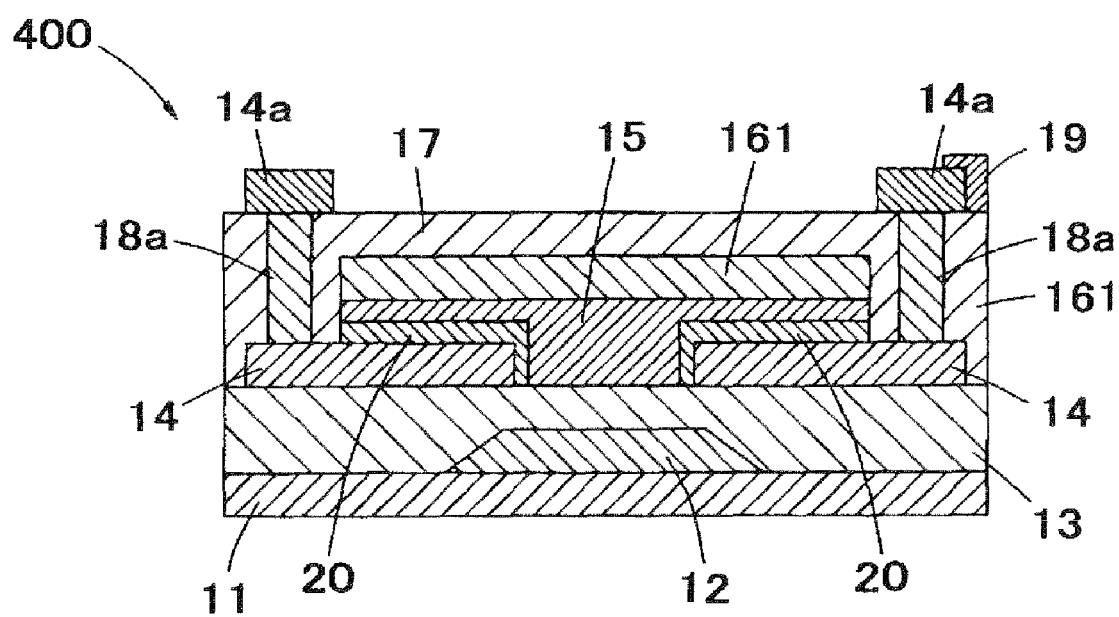
FIG. 7 is a cross-sectional view of the thin film transistor manufactured by a method according to the fourth embodiment of the present invention.

FIG. 7 is a cross-sectional view showing the structure of the thin film transistor 400 manufactured by the method according to the fourth embodiment of the present invention. The TFT 400 according to the fourth embodiment has some similar structures to the TFT 300 according to the third embodiment. These structures are denoted by the same reference numerals. However, in place of the overcoat insulating film 16 of the TFT 300 according to the third embodiment, TFT 400 according to the fourth embodiment includes a first overcoat insulating film and a second overcoat insulating film, which are denoted as the first overcoat insulating film 161 and the second overcoat insulating film 17.

The first overcoat insulating film 161 is formed so as to cover only the upper surface of the oxide semiconductor thin film layer 15. The first overcoat insulating film 161 is provided as a part of the gate insulating film. The first overcoat insulating film 161 serves as a protective film configured to protect the oxide semiconductor thin film layer 15 from resist stripper used in the manufacturing process.

The second overcoat insulating film 17 is provided for protecting the TFT 400. The second overcoat insulating film 17 is laminated to cover all the exposed surfaces of the first overcoat insulating film 161 and side surfaces of the oxide semiconductor thin film layer 15. The second overcoat insulating film 17 ensures that the entire side surfaces of the oxide semiconductor thin film layer 15 get covered even if some parts of them are not covered with the first overcoat insulating film 161.

The first overcoat insulating film 161 and the second overcoat insulating film 17 may be a silicon oxide ($SiO_x$) film; a silicon oxide nitride (SiON) film; a silicon nitride ($SiN_x$) film; or a silicon nitride ($SiN_x$) film doped with oxygen using oxygen or a compound containing oxygen. Preferably, the first overcoat insulating film 161 and the second overcoat insulating film 17 are formed with the $SiN_x$ film that is doped with oxygen using oxygen or a compound (e.g. $N_2O$) containing oxygen. Such a doped $SiN_x$ film has a higher dielectric constant than silicon oxide compounds ($SiO_x$) or silicon oxide nitride (SiON).

The first overcoat insulating film 161 and the second overcoat insulating film 17 are formed by, for example, a plasma-enhanced chemical vapor deposition (PCVD) process.

Referring to FIGS. 8A-8D, a manufacturing method of the thin film transistor (TFT) according to the fourth embodiment of the present invention will be described below.

Figure 8A:
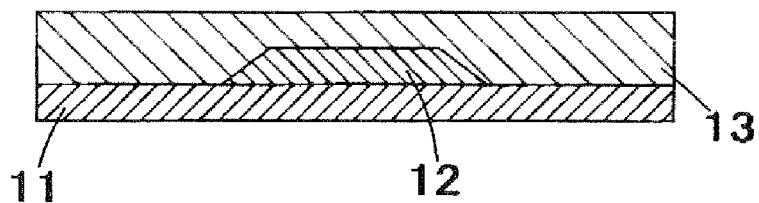
FIGS. 8A to 8D are cross-sectional views showing steps of the manufacturing method of the thin film transistor according to the fourth embodiment of the present invention.

First, as shown in FIG. 8A, a gate electrode 12 and a gate insulating film 13 are formed on a substrate 11 as in the third embodiment of the present invention.

Figure 8B:
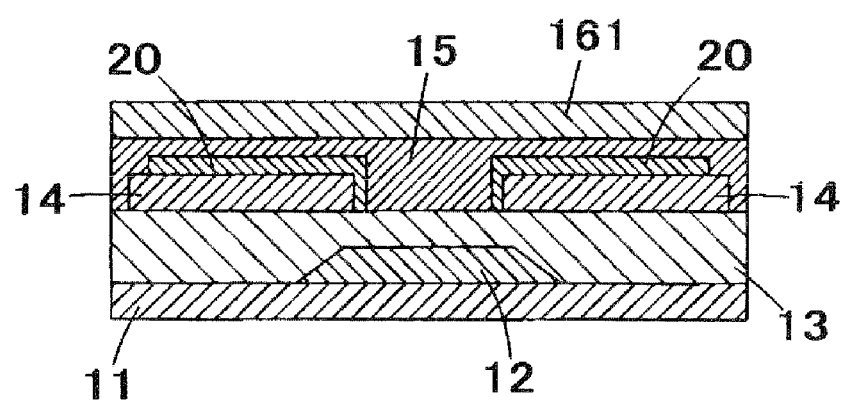

Next, as shown in FIG. 8B, source/drain electrodes 14, low resistance conductive thin films 20, an oxide semiconductor thin film layer 15, and a first overcoat insulating film 16 are laminated in this order on the gate insulating film 13. Then, the low resistance conductive thin films 20, the oxide semiconductor thin film layer 15 and the first overcoat insulating film 161 are simultaneously etched. Preferably, dry etching is used in the etching process because the dry-etched edges are positioned coincident with each other. Thus leakage current resulting from insufficient step coverage is suppressed, after the first overcoat insulating film 161 is formed.

As in the third embodiment of the present invention, if the low resistance conductive thin film 20 is made of zinc oxide doped with gallium (Ga) or aluminum (Al); or intrinsic zinc oxide (ZnO) with no impurity introduced, gases such as $CH_4$, $CF_4$, $CHF_3$, $Cl_2$, or gas containing one of these gases and oxygen may be used in the dry etching. On the other hand, if the low resistance conductive thin film 20 is made of indium tin oxide (ITO), gases such as $CH_4$ or a mixture of $CH_4$ and oxygen may be used. In the fourth embodiment of the present invention, for example, common reactive ion etching (RIE method) or inductively coupled plasma (ICP) etching may be used in the dry etching process, as in the first embodiment of the present invention.

Figure 8C:
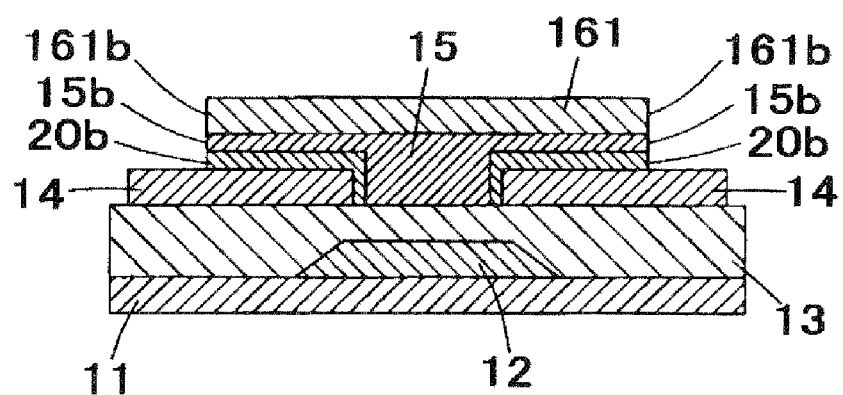

FIG. 8C shows a cross-section of a lamination comprising the oxide semiconductor thin film layer 15, the low resistance conductive thin films 20, and the first overcoat insulating film 161 after etching and removing the photo-resist. Etched surfaces 15b, etched surfaces 20b, and etched surfaces 161b of the above-mentioned layers are positioned coincident with each other. Consequently, sufficient step coverage is maintained after a second overcoat insulating film 17 is formed.

The first overcoat insulating film 161 also protects the oxide semiconductor thin film layer 15 while an active region of the TFT is patterned. If the first overcoat insulating film 161 is not present, when the resist stripper is used to remove photo-resist after the patterning of an active layer, the resist stripper contacts with the surface of the oxide semiconductor thin film layer 15. The resist stripper generally etches and roughens the surface and crystal grain boundary of the oxide semiconductor thin film layer 15. However, if the first overcoat insulating film 161 is present on the surface of the oxide semiconductor thin film layer 15, the first overcoat insulating film 161 functions as a protective film against various kinds of liquid chemicals such as a resist stripper used in a photolithography process. The first overcoat insulating film 161 therefore prevents the surface of the oxide semiconductor thin film layer 15 from roughening. Thus, sufficient interface properties between the oxide semiconductor thin film layer 15 and the first overcoat insulating film 161 are maintained.

Figure 8D:
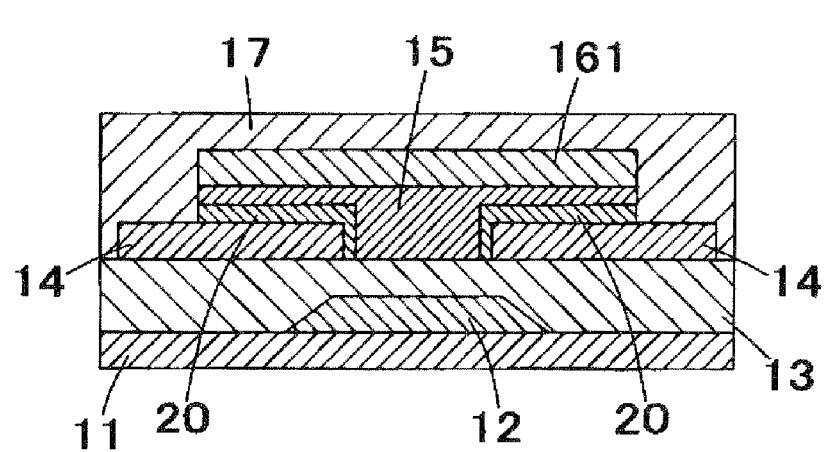

Referring to FIG. 8D, after the active layer region of the TFT is patterned, a second overcoat insulating film 17 is formed on all the exposed surfaces of the gate insulating film 13, the source/drain electrodes 14, the oxide semiconductor thin film layer 15, the low resistance conductive thin films 20, and the first overcoat insulating film 161.

Then contact holes are opened in the first overcoat layer 17 to expose portions of the source/drain electrodes 14. External source/drain electrodes 14a, which are connected to the source/drain electrodes 14 via contact parts 18a, are formed. Then a display electrode 19 is formed in the final step to form a TFT array of the fourth embodiment of the present invention (See the TFT shown in FIG. 7).

As described above, the thin film transistor manufactured by the method according to the present invention has excellent performance so that it is preferably used as an active element of a liquid crystal display device and the like.

What is claimed is:

1. A manufacturing method of a thin film transistor comprising:
   forming a source/drain electrode on a substrate;
   forming low resistance conductive thin films on the source/drain electrode;
   forming an oxide semiconductor thin film layer on the low resistance conductive thin films;
   forming a first gate insulating film on the oxide semiconductor thin film layer;
   etching the first gate insulating film, the low resistance conductive thin films, and the oxide semiconductor thin film layer such that (i) side surfaces of the first gate insulating films, corresponding side surfaces of the low resistance conductive thin films, and corresponding side surfaces of the oxide semiconductor thin film layer coincide with each other in a channel width direction of a channel of the thin film transistor, and (ii) a width of the first gate insulating film is wider than a width of the source/drain electrode in the channel width direction of the channel;
   forming a second gate insulating film on the first gate insulating film; and
   mounting a gate electrode over the second gate insulating film.

2. The method according to claim 1, wherein the oxide semiconductor thin film layer primarily comprises zinc oxide.

3. The method according to claim 1, wherein the etching is dry etching.

4. A manufacturing method of a thin film transistor comprising:
   forming a gate electrode on a substrate;
   forming a gate insulating film on the gate electrode and forming a source/drain electrode on the gate insulating film;
   forming low resistance conductive thin films on the source/drain electrode;
   forming an oxide semiconductor thin film layer on the low resistance conductive thin films;
   forming a first overcoat insulating film on the oxide semiconductor thin film;
   etching the first overcoat insulating film, the low resistance conductive thin films, and the oxide semiconductor thin film layer such that (i) side surfaces of the first overcoat insulating film, corresponding surfaces of the low resistance conductive thin films, and corresponding side surfaces of the oxide semiconductor thin film layer coincide with each other in a channel width direction of a channel of the thin film transistor, and (ii) a width of the first overcoat insulating film is wider than a width of the source/drain electrode in the channel width direction of the channel; and
   forming a second overcoat insulating film on the first overcoat insulating film.

5. The method according to claim 4, wherein the oxide semiconductor thin film layer primarily comprises zinc oxide.

6. The method according to claim 4, wherein the etching is dry etching.

7. A manufacturing method of a thin film transistor comprising:
   forming a predetermined number of pairs of source/drain electrodes, each said pair comprising a source electrode and a drain electrode defining a gap therebetween at an area corresponding to a channel of the thin film transistor, and each said pair being spaced apart from an adjacent pair by a spacing;

forming a pair of low resistance conductive thin films, which define a gap therebetween along the channel-corresponding area, such that one of the low resistance conductive thin films covers the source electrodes and another of the low resistance conductive thin films covers the drain electrodes;

forming an oxide semiconductor thin film layer on the pair of low resistance conductive thin films, on the channel-corresponding area, and on each said spacing; and etching the oxide semiconductor thin film layer and the low resistance conductive thin films along each said spacing between adjacent pairs of the source/drain electrodes, to separate each of the oxide semiconductor thin film layer and the low resistance conductive thin films into a predetermined number of oxide semiconductor thin film layer pieces and a predetermined number of pairs of low resistance conductive thin film pieces corresponding respectively to the predetermined number of pairs of source/drain electrodes, such that at each said spacing side surfaces of each of the oxide semiconductor thin film layer pieces coincide with corresponding side surfaces of the pair of low resistance conductive thin film pieces corresponding to the oxide semiconductor thin film layer piece.

8. The method of according to claim 7, wherein the forming of the pair of low resistance conductive thin films comprises etching a low resistance conductive thin film to form the pair of low resistance conductive thin films to have outer ends that are positioned outside outer ends of a final shape of the low resistance conductive thin films.

* * * * *